(12) United States Patent  (10) Patent No.: US 8,195,105 B1
Erickson  (45) Date of Patent: Jun. 5, 2012

(54) POWER AMPLIFIER ADAPTIVE PRESET GAIN CONTROL

(75) Inventor: Alan R. Erickson, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1142 days.

(21) Appl. No.: 11/973,765

(22) Filed: Oct. 10, 2007

(51) Int. Cl.
*H04B 17/00* (2006.01)

(52) U.S. Cl. ................................. 455/115.1; 455/127.2

(58) Field of Classification Search .............. 455/91, 455/114.1, 115.1–115.3, 126, 127.1, 127.2, 455/127.3, 127.4; 330/129, 149
See application file for complete search history.

(56) References Cited

U.S. PATENT DOCUMENTS

| | | | |
|---|---|---|---|
| 4,514,703 | A | 4/1985 | Maher et al. |
| 4,523,155 | A | 6/1985 | Walczak et al. |
| 4,996,500 | A | 2/1991 | Larson et al. |
| 5,313,658 | A | 5/1994 | Nakamura |
| 5,661,442 | A | 8/1997 | Sparks |
| 5,790,068 | A | 8/1998 | Musbach et al. |
| 5,960,333 | A | 9/1999 | Repke et al. |
| 6,041,035 | A | 3/2000 | Thedens |
| 6,759,902 | B2 | 7/2004 | Kossor |
| 7,023,278 | B1 | 4/2006 | Vagher et al. |
| 7,398,063 | B2 * | 7/2008 | Blosco et al. ............. 455/127.1 |
| 2005/0191975 | A1 * | 9/2005 | Talwalkar et al. ......... 455/115.1 |
| 2006/0189285 | A1 * | 8/2006 | Takano et al. .............. 455/127.2 |
| 2006/0199552 | A1 * | 9/2006 | Blech et al. ................ 455/127.1 |
| 2006/0234656 | A1 * | 10/2006 | Matsui et al. .............. 455/127.3 |

OTHER PUBLICATIONS

Mitola, Joseph, Object-Oriented Approaches to Wireless Systems Engineering, Software Radio Architecture, 2000, pp. 1-9, 144-148, 214-215, United States.
Collins Radio Company, Fundamentals of Single Side Band, 1957, pp. 7-10,7-11, United States.
Krauss, et al., Solid State Radio Engineering, 1980, pp. 511-513, Virginia.

* cited by examiner

*Primary Examiner* — Thanh Le
(74) *Attorney, Agent, or Firm* — Donna P. Suchy; Daniel M. Barbieri

(57) ABSTRACT

The present example provides for adaptive preset gain control. Adaptive Preset gain control may initially utilize calibration look up table values to initially set a power amplifier's gain. Subsequent additional corrections are determined and an adaptation look up table is created and applied to bring operation within tolerance. To maintain the amplifier within tolerance additional corrections may also be determined and added to the Adaptation Look Up table. In an alternative example the Calibration Look Up Table may be omitted, with a first transmission through the power amplifier acting as a training event. The Adaptation Look Up Table, may, by storing the last corrections form a history of prior operation which may be used as built in test to indicate potential system failures.

20 Claims, 5 Drawing Sheets

POWER AMPLIFIER ADAPTIVE PRESET GAIN CONTROL

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract No. DAAB07-02-C-C403 awarded by the U.S. Army Communications-Electronics Acquisition Center.

TECHNICAL FIELD

This description relates generally to feedback circuits and more specifically to automatic power level control of amplifiers.

BACKGROUND

Radios often employ amplifier circuits in their construction to boost weak signal levels encountered to useable levels within the radio. Radios may also seek to boost signal levels to those sufficient for transmission, in which case power amplifiers ("PAs") may be used. Amplifiers may include associated control circuits to control the amplifier, such as compensating for variations in input drive levels. Control circuits may impact the ability of a power amplifier to operate properly because of the characteristics of various types of transmitted signals that may be processed by the amplifier.

SUMMARY

The following presents a simplified summary of the disclosure in order to provide a basic understanding to the reader. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

The present example provides for adaptive preset gain control ("APGC") which may be equivalently termed preset adaptive gain control ("PAGC"). Adaptive Preset gain control may initially utilize one or more calibration look up tables ("CLUT" or "Calibration LUT") containing values to initially set a power amplifier's gain to predetermined values obtained from design analysis, factory test, or other suitable sources. Subsequent additional corrections may be determined and most likely (but not necessarily) applied during operation to maintain the amplifier within tolerance. An adaptation look up table ("ALUT" or "Adaptation LUT") may be created to store these additional corrections that may be used during subsequent operation, such as a later transmission.

In an alternative example, the Calibration LUT may be omitted, with a first transmission through the power amplifier acting as a training event. As such the training event may be used to set the initial gain.

In a further alternative example the Adaptation LUT may be used for built in test ("BIT") to indicate potential system failures. This may be achieved by storing the last corrections to form a history of prior operation.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1:
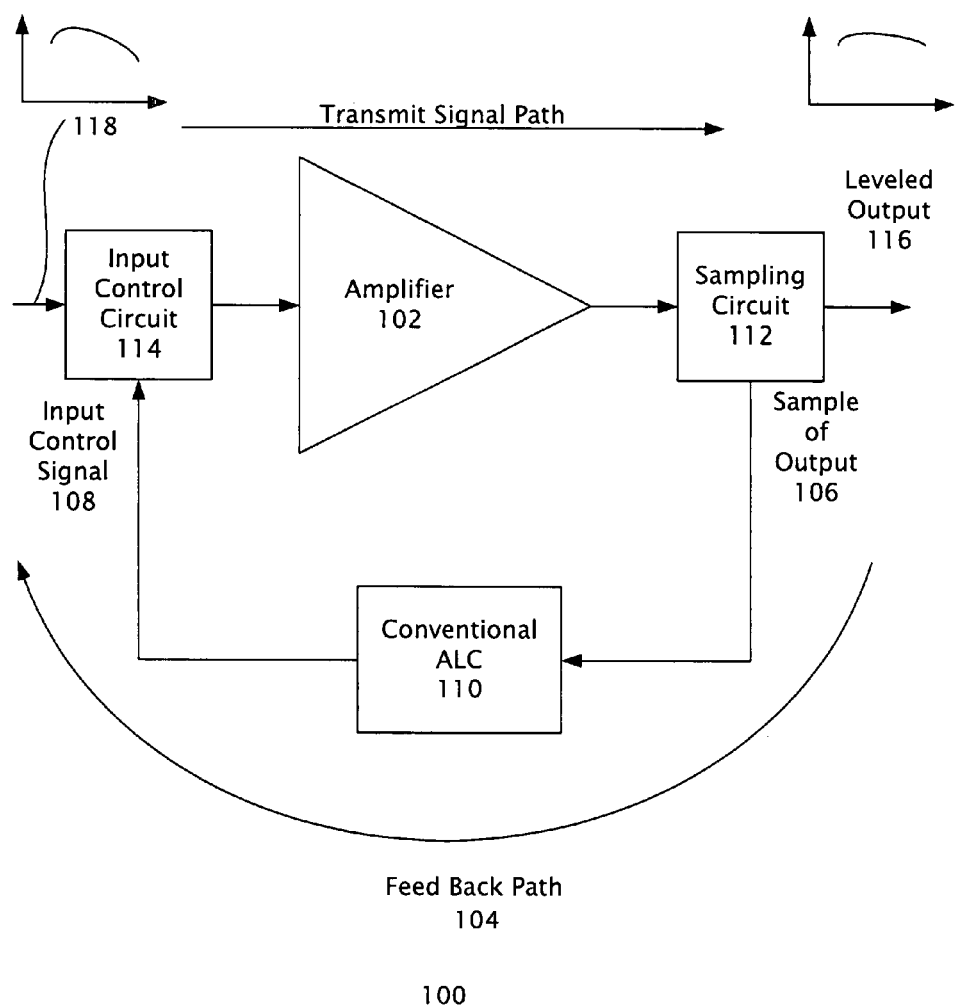
FIG. 1 is a block diagram of an amplifier being controlled by conventional level control circuitry

FIG. 1 is a block diagram of an amplifier being controlled by conventional control circuitry 100. A conventional amplifier 102, (or equivalently, a power amplifier ("PA"), low noise amplifier or the like) may employ feedback 104 to control its amplification, or gain. An amplifier generally includes one or more active devices, or transistors, with matching circuits designed to optimize various available transistor parameters such as transistor noise figure (low noise amplifiers), transistor gain (small signal amplifiers) or power output (power amplifiers). The various types of amplifiers are in general equivalent to each other for the purposes of the application of automatic level controls and will be treated as such in this document. Amplifiers may often be utilized over large bandwidths that may often approach a decade, to strengthen conventional signals. Maintaining near constant amplification over a range of frequencies and possibly at different power levels may call for gain control techniques. Conventional gain control may employ feedback 104 methods, as amplifier 102 gain tends to vary due to frequency response and power level without compensating circuitry.

In the leveling of output power over a frequency range by the application of feedback, a portion of the output (the feedback or output sample 106) may be returned to the input 108 to modify the operating characteristics of the amplifier. Feedback can be positive (regenerative), such as in a feed forward power amplifier that may be used for in cellular telephone base stations. Or, feedback can be negative (degenerative) as is often used in the gain control of single tone radio frequency power amplifiers. Either type of feedback may be utilized in a number of conventionally known ways to control the amplifier. The feedback signal may also simply represent the output signal level for use in adjusting the amplifier's output power to prescribed values There may be various ways to level the output with feedback. Typically, an input control signal 108 may be generated for application at the circuit input. Input control signals may include those for varying the input level (typically through a variable attenuator), varying the gain of the amplifier, and the like.

In addition, the input control signals should not degrade the system stability. In a feedback circuit, the feedback loop may be formed such that it can introduce instability into the circuit that is being controlled that can cause oscillations. Feedback may also be conditioned to provide stability as governed by conventional control circuit theory, such as loop stability criteria.

The input control signal and the feedback are typically generated by appropriate circuits 110, 112. For example, a portion of the output for the feedback signal may be obtained through conventional sampling circuitry 112. The input control signal 108 may be generated by conventional automatic level control ("ALC") circuitry 110 that further conditions the output of the conventional sampling circuitry 112. A conventional input control circuit 114 may control the amplifier 102 to cause a level output 116 to be produced. However, these conventional leveling methods typically do not provide adequate level control for many newer signal types being processed in an amplifier.

Further conditioning by the conventional automatic level control 110 may be needed to address how the feedback may be used to control the amplifier circuit. For example, modulated radio signals applied to a radio frequency amplifier may necessitate differing automatic level control approaches. Differing modulations that may be increasingly used, tend to call for specialized types and approaches to ALCs to perform properly. A current trend may be to produce radios that are capable of handling many signal types, which would typically call for the development of differing types of ALCs. Thus, developing an automatic level control that can regulate an amplifier processing many new and varied signal types can be challenging.

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

The examples below describe an adaptive preset gain control. Although the present examples are described and illustrated herein as being implemented in an amplifier system of a software defined radio ("SDR"), the system described is provided as an example and not a limitation. In addition, the modulated signal being controlled by the adaptive preset gain control may be an orthogonal frequency domain multiplexing ("OFDM") signal. However, this modulation is only provided as an example showing exemplary design issues addressed by APGC. adaptive preset gain control may be applicable to other equivalent signal types being amplified. As those skilled in the art will also appreciate, the present examples are suitable for application in a variety of different types of feedback systems.

Software defined radio is a development that seeks to create a radio that can send and receive virtually any type of radio signal. This can be a challenge because radio hardware (or equivalently circuitry) tends to be specialized or tailored to the type of radio signal being processed. Thus, circuitry such as adaptive preset gain control that can control many types of radio signals continues to be developed, and in particular this includes circuitry that can be configured by software. One of these specialized circuits that has been developed is the gain control circuit (the adaptive preset gain control) for the amplifiers of the software defined radio. Developing a gain control circuit to function properly with a multitude of signal types, and/or new modulations can be addressed with adaptive preset gain control. In particular, the gain control of an amplifier amplifying Orthogonal Frequency Domain Multiplexing ("OFDM") signals or their equivalent, among other signal types may utilize adaptive preset gain control advantageously. This can be because OFDM has characteristics that can make it difficult to measure output power precisely to determine initial amplifier gain settings (or power output) until the signal has been present for some time.

Figure 2:
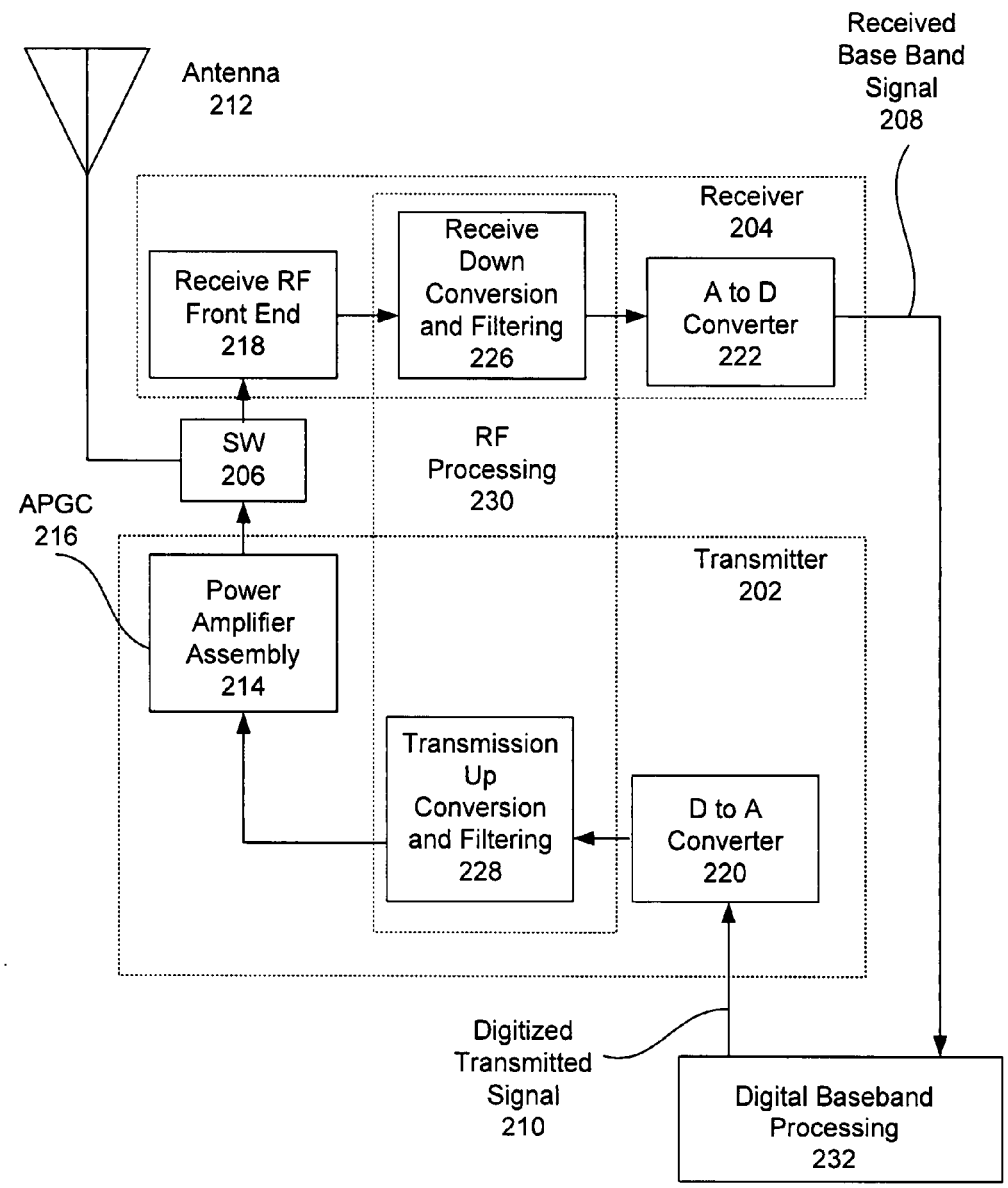
FIG. 2 is a block diagram of a software defined radio having adaptive preset gain control ("APGC").

FIG. 2 is a block diagram of a software defined radio 200. Radio communications has evolved from simple crystal radio sets to complex communications systems such as cellular telephone systems, trunked radio systems utilized by the police, and military command, control, computing, communication and intelligence ("C4I") communications systems, among others. However, all of these systems tend to be made up of a variety of radios that are often incompatible for communicating with each other, except in narrowly defined ways within their own system. For example, in a cellular network the old analog telephones could not be used to receive a digital cellular signal, and had to be replaced. In an effort to increase communications, flexibility and interoperability within a communications system, and to allow the updating of the system for new uses, a move to radios that may be reconfigured with software may be occurring. A software defined radio architecture is further described in "Open System Modular Electronics Architecture" by Thedens, U.S. Pat. No. 6,041,035, filed Jun. 30, 1997, the contents of which are incorporated herein by reference. However, such a useful radio presents many design challenges especially to hardware which typically must be more general in nature. The provision of an adaptive preset gain control as described below allows generic hardware in open system software defined radios to support a variety of waveforms.

Maintaining transmitter power output without distorting or degrading waveform characteristics can be a difficult challenge because of circuit and system variations and tolerances. A software defined radio is typically a radio where the channel modulation waveforms are defined in software. For example, a software defined radio may be capable of wideband operation, narrow-band operation, frequency hopping, and various types of waveform modulation. The problem may be exacerbated in a software defined radio, such as the exemplary joint Tactical Radio System ("jTRS") because of the potential need for the hardware to support many different waveforms over a wide range of frequencies, bandwidths and types of modulation.

A software defined radio can be a radio in which it is desired to be able to tune the radio to almost any frequency band and receive almost any modulation across a typically large frequency spectrum. This is typically sought to be achieved by programmable hardware which may be controlled by software.

A software defined radio typically processes the wide variety of radio signals by executing methods of signal processing by a general purpose computer, a reconfigurable piece of digital electronics such as a field programmable gate array ("FPGA") or other type of dedicated processing circuit. With software defined radio, a single radio can receive and transmit a wide variety of radio protocols (which may include different types of modulation) just by running a different software application. Such a radio allows more people to communicate in various manners, with simpler hardware. In addition, new communications protocols may be implemented simply by updating the radio software. Software defined radios can have utility for the military and cell phone services, and others which may serve a wide variety of changing radio protocols in real time.

The hardware used by a software-defined radio typically consists of super-heterodyne radio frequency ("RF") conversion (typically achieved by mixing) and filtering which converts RF signals from analog intermediate frequency ("IF") signals for transmission (or from RF to an IF for the case of a receiver), and digital to analog ("D-A" or "D to A") converters and analog to digital ("A-D" or "A to D") converters which convert digitized IF signals to (and from) analog form, respectively. Software defined radios have in common the digital processing of information. In particular software defined radio may perform direct sampling of intermediate frequencies to implement a "digital IF". Additionally, analog conversion (mixing) from (and to) baseband may be performed in alternative examples of software defined radio with D-A and A-D converters operating at baseband. Such an implementation may include hardware, such as In phase and quadrature ("IQ") mixers) to convert directly to baseband for demodulation and subsequent conversion to digital baseband via an A-D, and a hardware modulator which can be achieved with an IQ mixer following a D-A, all of which are known to those skilled in the art.

In further alternative examples of software defined radio there may also be direct conversion receivers (and transmitters) which typically do not have IF but convert directly from baseband to RF (and vice versa for receive) which may also be suitable for use with PAGC. The modulation (and demodulation) may be in hardware rather than a digitized IF.

In particular, a software defined radio transceiver 200, typically includes a receiver 204 and a transmitter 202. Typically, a conventionally constructed antenna 212 or other mechanism conducts a signal to the transceiver 200. A conventionally constructed switch 206, routes the signal either to a receive path coupled to the receiver 204, or to a transmit path coupled to the transmitter 202. In equivalent examples a software defined radio configured for full duplex communications may also utilize APGC.

In the receiver 204, the signal from the switch 206 may be coupled to a conventionally constructed receive RF front end 218 providing broad spectrum filtering (including rejection from signals related to mixer image and spurious products) and amplification (that may include APGC). The receive RF front end 218 may be coupled to specially constructed receive down conversion and filtering circuits 226 (that may include APGC) of the RF processing circuits 230. (Alternatively, one adaptive preset gain control having a larger look up table may be utilized for both the RF front end and down conversion and filtering circuits). The receive down conversion and filtering circuits 226 of the RF processing 230, may be in turn coupled to a conventionally constructed analog to digital ("A to D") converter 222. The A to D converter 222 creates a digitized receive signal 208 which can be coupled to a conventionally constructed digital baseband processing circuit 232. The digitized receive signal 208 may be audio or data signals.

Moving to the transmission path, a digitized transmitted signal 210, from the digital base band processing circuit 232, which may be audio or data signals, may be coupled to a conventionally constructed D to A converter 220. The D to A converter 220 can be coupled to specially constructed transmit up conversion and filtering circuits 228 (that may include APGC) of the RF processing circuits 230. The output of the Transmit up conversion and filtering circuits 228 can be coupled to power amplifier assembly 214. Power amplifier assembly 214, may include one or more individual APGA circuits 216 to regulate the power amplifier gain. Alternatively, one adaptive preset gain control having a larger look up table may be utilized. The power amplifier assembly 214 may be in turn coupled to the input of switch 206 where the amplified signal may be routed to the antenna 212 when transmitting.

The switch 206, the D to A converter 220, the A to D converter, 222, the receiver RF front end, and the digital baseband processing 232, are all conventionally constructed for producing the desired modulations. The RF processing circuits 230 including processing circuits 226 and 228, may be conventionally constructed, or in alternative examples may include one or more adaptive preset gain control controls of their amplifiers. The power amplifier assembly 214 can be specially constructed having one or more adaptive preset gain control circuits 216. Conventional power amplifier circuits in the power amplifier assembly 214 may include those made of silicon, gallium nitride, or their equivalent. Thus the example of a software defined radio described above uniquely includes APGC.

The adaptive preset gain control may include a processor, a field programmable gate array or its equivalent to generate adaptive programmable gain adjustment. In addition, the RF processing 230 may be conventionally constructed and include a digital signal processing circuit, a processor or its equivalent. A portion of the processing functions for the adaptive preset gain adjustment may be shared with this processor or others such as those in the digital baseband processing 232 that may be present in alternative examples of a software defined radio.

Message information may be transformed or modulated by the RF processing 230 and/or digital baseband processing 232 into information suitable for electronic communications over a communications channel (or carrier frequency) by various methods. A software defined radio 200 is typically capable of processing a variety of modulated signals. Two typical types of signals that can be found in software defined radio can include the analog and digital modulation of a signal. Analog modulation may include frequency modulation ("FM"), amplitude modulation ("AM"), single side band ("SSB"), phase modulation ("PM"), quadrature amplitude modulation ("QAM") and the like. Digital modulation may include: continuous wave ("CW"), amplitude shift keying ("ASK"), phase shift keying ("PSK"), frequency shift keying ("FSK"), quadrature amplitude modulation ("QAM"), continuous phase modulation ("CPM") and the like. However, the distinctions can be considered somewhat artificial; for example QAM may be considered either an analog or digital modulation technique.

Also, signal transmission capacity may be increased by multiplexing a plurality of modulated signals onto one (or more) communications channels (which can be separate carrier frequencies). Multiplexing allows multiple signals to share channel resources. Digital multiplexing may include orthogonal frequency domain multiplexing ("OFDM"), time division multiple access ("TDMA"), code division multiple access ("CDMA"), carrier sense multiple access ("CSMA") and the like. Software defined radio may be capable of processing these types of multiplexed signals as well. In TDMA signals there are typically a series of short transmissions. APGC may be especially well suited to amplifier gain control of amplifiers amplifying this type of signal. This may be because the settings determined from one TDMA "time slot" may then used on subsequent slots. Further, time slots are generally short such that long term effects such as temperature are usually minimal during any single transmission. It is typically the ability of adaptive preset gain control to use one transmission to become more precise on other transmissions that give it a distinct advantage.

Signal transmission capacity may also be increased by spreading the energy in a message signal over the available frequencies. Spread spectrum may include frequency hopping spread spectrum ("FHSS"), and discrete sequence spread spectrum ("DSSS"). Spread spectrum techniques provide transmission security because they are usually harder to detect. In addition software defined radio may be capable of providing additional levels of security provided by the addition of the encryption of base band signals and/or transmission security methods. Development of software defined radio continues to seek ways to interchangeably process these various types of signals, and in particular, the processing of OFDM signals presents a challenge.

Of the above listed modulation methods, OFDM has developed into a popular scheme for wideband digital communication systems. Orthogonal Frequency Division Multiplexing (OFDM) as noted above is typically a digital multi-carrier modulation technique. An OFDM signal may be a single signal which includes a large number of closely-spaced subcarriers with orthogonal phase and frequency relationships so each subcarrier can be separately modulated (and demodulated), generally to allow a single modulation symbol to contain a large number of digital bits. Each subcarrier may be modulated with a conventional modulation scheme (such as DPSK or n-ary PSK) at a low symbol rate with the resulting signal having a high data rate because of the large number of subcarriers. This allows maintaining data rates similar to conventional single carrier modulation schemes in the same bandwidth. In practice, OFDM signals may be generated using the Fast Fourier transform algorithm in the digital baseband processing which can be amendable to the processing capability of a software defined radio.

OFDM is typically able to cope with severe channel conditions, and is thus a popular modulation choice. OFDM signals exhibit a high peak to average power ratio (PAPR) because the independent phases of the subcarriers mean that they will often combine constructively or destructively. In a PA, signals having peak powers are often limited with automatic level control circuitry to prevent distortion caused by the amplifier. The nature of OFDM can be that in both the time domain and frequency domain the signal in space may appear random and appears similar to Gaussian noise. This can make measuring power difficult. The difficulty in measuring power can make gain control of the amplifier difficult, especially in setting initial values of amplifier gain to maintain a prescribed power output.

Non-linearity in the power amplifier can cause the undesired effects of intermodulation distortion raising the noise floor, causing intersymbol interference, or generating spurious signals out of band. Thus, it may be desirable to maintain linearity in radio components, such as the PA. Linearity in a power amplifier is typically maintained by use of an automatic level control circuit to maintain output power below the level where significant distortion occurs. However, for OFDM and other similar radio signals, a conventional ACC may not be satisfactory. In these situations, adaptive preset gain control may be called for. APGC may be implemented in the RF processing and power amplifier sub assemblies in a software defined radio.

Conventional (or dynamic) automatic level control is typically based on well-proven peak-responding, amplitude (or alternatively envelope-following), closed-loop feedback approaches having a fast attach and slow decay which has tended to serve legacy modulations and bandwidths well. Conventional ALC's tend to compensate for large variation and unpredictability of power amplifier gains, system losses, antenna VSWR, and input drive levels. A prior example of a software defined radio can be the Ground Mobile Radio ("GMR") which, in a previous version implements a transition of power amplifier automatic level control, control circuits from analog to digital. GMR may use software defined radio techniques to implement a number of existing waveforms in a single radio. However, power control with the existing waveforms and modulation types may be based on maintaining all RF peaks at the power amplifier compression point, which may be undesirable for more advanced types of modulation which may benefit from APGC.

Current examples of software defined radio may include wide bandwidths, multi-carrier OFDM modulation, and often unique hardware requirements of the power amplifier Line Replaceable Unit ("LRU") specification. Such features may be encountered in a software defined radio which may utilize an adaptive preset gain control. In the newer Wideband Networking Waveforms ("WNWs") being implemented, conventional methods of power level control typically can not be used successfully using modulation such as OFDM.

OFDM has a Gaussian-noise like characteristic in both the time domain and frequency domain. OFDM signal power may be defined by its average (or rms) value. In OFDM signals, the maximum peaks (~10 dB or more above average) tend to make gain control methods more difficult. In general one may not want to respond to the peaks, but to average power. And, to avoid excessive clipping, the average power relative to the compression level of the power amplifier typically must be controlled precisely. Simply slowing down the automatic level control to respond to average power can be undesirable because it does not provide proper power levels at the start of a signal being present (the signal "rise time" is often faster than the time needed to average the output signal to measure power), and slowing down automatic level control does not provide protection of the power amplifier from rapid, large overdrive signals. A conventional automatic level control typically samples at up to 10M-samples/sec which may be insufficient to close a classic control loop having a 10 MHz envelope content. Therefore, it may not be desirable to continue using legacy envelope-following automatic level control with OFDM modulation. Where the initial "rise time" of the signal may be important, the automatic level control is usually unable to provide acceptable time-domain characteristics.

An alternative to an automatic level control can be to compensate the system so that it produces a constant gain using, say, calibration from Look Up Tables ("LUT"). However, LUT compensation typically does not respond to changes in parameters (often external to the amplifier) often expected in normal operation, such as variations of input drive, temperature, load impedance, etc. Combining LUT compensation with automatic level control can result in marginal improvements.

To improve automatic level control and LUT calibration, adaptive preset gain control uses a unique automatic level control and LUT method having adaptation. Adaptation is typically accomplished by initially using only the LUT calibration values from a Calibration LUT for initial power amplifier gain settings. The resulting output power may be initially out of tolerance, however corrections can be determined (similar to automatic level control operation, with or without actually changing the output power during a transmission) and may be stored in a second or Adaptation LUT.

The power output for subsequent transmissions may be determined by combining values from the calibration LUT and the adaptation LUT. This results in operation that tends to be within tolerance. Use of adaptation maintains the "rise time" characteristics of modulated signals which can be distorted by ALC, or not accurately represented by a calibration LUT alone.

Each transmission causes updates to the adoption LUT to maintain output power as conditions vary. This approach can be viable for maintaining system output power because most of the variations tend to occur at a rate that may be slower than the rate of a series of transmissions. Since adaptive preset gain control may be initially set very close to the desired value there is typically little variation (typically meaning little distortion), with the typical advantages of power being set prior to the time otherwise needed to complete long integration times needed to accurately measure the average power. In addition, this approach tends not to preclude slow (not distorting) corrections by the automatic level control during a long transmission wherein an automatic level control loop may be provided to remain "active" to adjust for remaining variations.

In an alternative example, it may be possible to eliminate the initial calibration LUT and use only the adaptation LUT if the initial transmission is allowed to be a "training" event.

An adaptation LUT advantageously retains the last corrections, typically allowing a history of the prior operation to be retained. The magnitude of corrections tends to indicate deviation from the initial calibration LUT, which can be used by a built in test ("BIT") to indicate system failures.

Thus, a different automatic level control approach, such as, the adaptive preset gain control may be needed to be successful with OFDM in a software defined radio. The adaptive preset gain control functions may conveniently be provided in the RF processing 230 and power amplifier assemblies 214.

Figure 3:
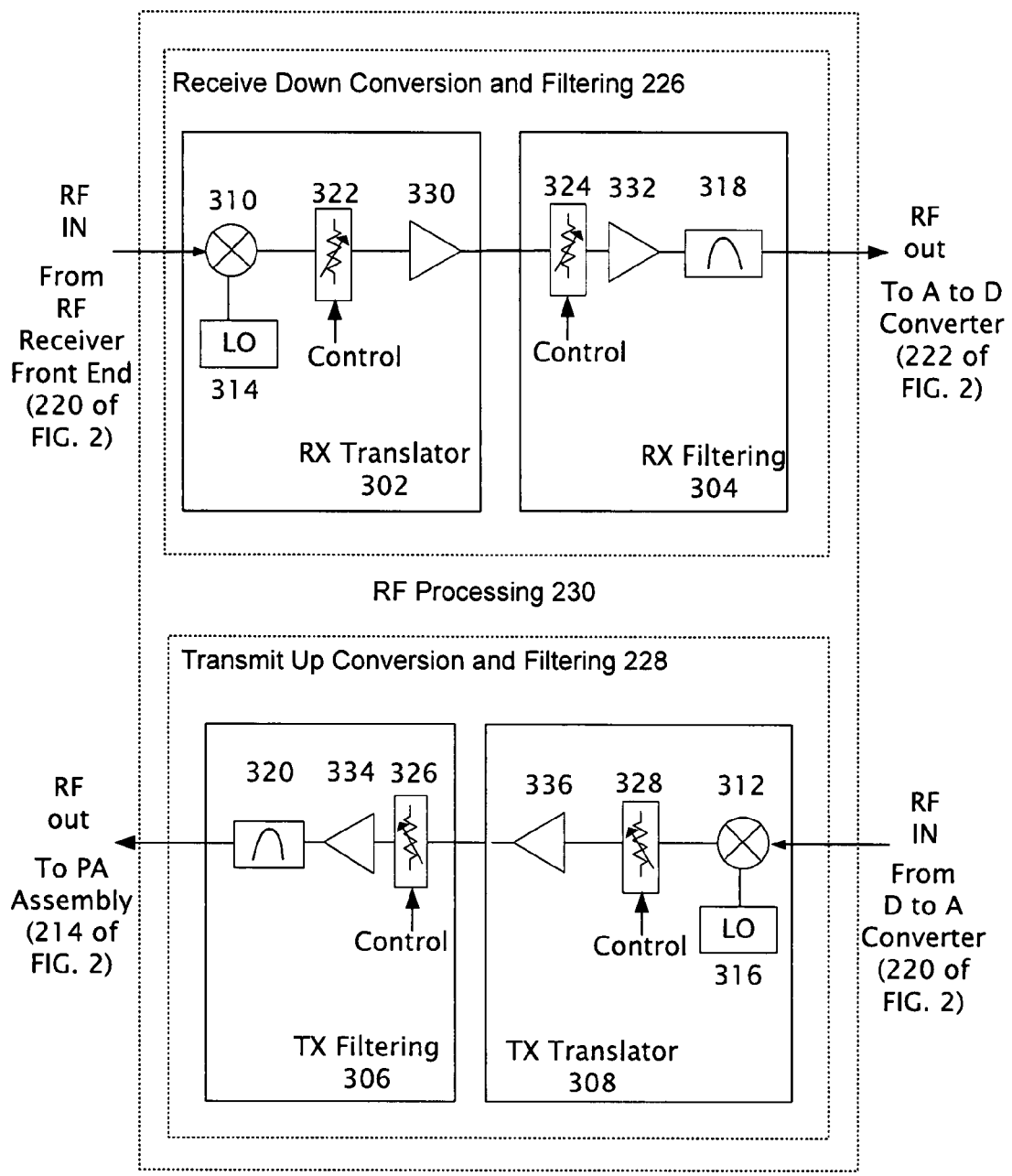
FIG. 3 is a block diagram showing details of the radio frequency processing circuitry of the software defined radio, radio frequency processing circuitry may include a receive down conversion and filtering circuit and a transmit up conversion and filtering circuit.

FIG. 3 is a block diagram showing details of the RF processing circuitry of the software defined radio. RF processing circuitry 230 may include a receive down conversion and filtering circuit 226 and a transmit up conversion and filtering circuit 228. Within these circuits 226, 228 adaptive preset gain control may be used to control the various gain blocks 330, 332, 334, 336, by applying an adaptive preset gain control, control signal to one or more corresponding programmable gain attenuators 322, 324, 326, 328.

The receive down conversion and filtering circuit 226, may include a receiver ("RX") translator circuit 302 and a receiver filtering circuit 304. In the Rx translator circuit 302 a filtered signal from the RF receiver front end (218 of FIG. 2) may be coupled to a RF input of mixer 310. Mixer 310 may also include a local oscillator input coupled to a local oscillator 314. The output, or IF, of mixer 310 may be coupled to the input of a programmable gain attenuator ("PGA") 322. The output of programmable gain attenuator 322 may be coupled to an input of an amplifier 330. The output of amplifier 330 may be coupled to the input of RX filtering circuit 304.

The input of RX filtering circuit 304 may be coupled to the input of a programmable gain attenuator 324. The output of programmable gain attenuator 324 may be coupled to the input of an amplifier 332. Output of amplifier 332 may be coupled to the input of a RF filtering circuit 318, the output of which may be coupled to the input of an A to D converter (222 of FIG. 2). The RF amplifiers 330, 332 may be controlled by one or more control signals (which may be one or more APGC control signals) applied to control inputs of corresponding programmable gain attenuators 322, 324. Components 310, 314, 322, 330, 324, 332, and 318 may be conventionally constructed.

The transmit up conversion and filtering circuit 228 may include a transmitter ("TX") translator circuit 308 and a transmitter filtering circuit 306. In the TX translator circuit 308 a signal (already filtered to remove aliasing products) from the D to A converter (220 of FIG. 2) may be coupled to a RF input of mixer 312. Mixer 312 may also include a local oscillator input coupled to a local oscillator 316. The output, or IF, of mixer 312 may be coupled to the input of a programmable gain attenuator ("PGA") 328. The output of programmable gain attenuator 328 may be coupled to an input of an amplifier 336. The output of amplifier 336 may be coupled to the input of TX filtering circuit 306.

The input of TX filtering circuit 306 may be coupled to the input of a programmable gain attenuator 326. The output of programmable gain attenuator 326 may be coupled to the input of an amplifier 334. Output of amplifier 334 may be coupled to the input of a RF filtering circuit 320, the output of which may be coupled to the input of the power amplifier assembly (214 of FIG. 2). The RF amplifiers 336, 334 may be controlled by one or more control signals (which may be one or more APGC control signals) applied to control inputs of corresponding programmable gain attenuators 328, 326. Components 312, 316, 328, 336, 326, 334, and 320 may be conventionally constructed.

Figure 4:
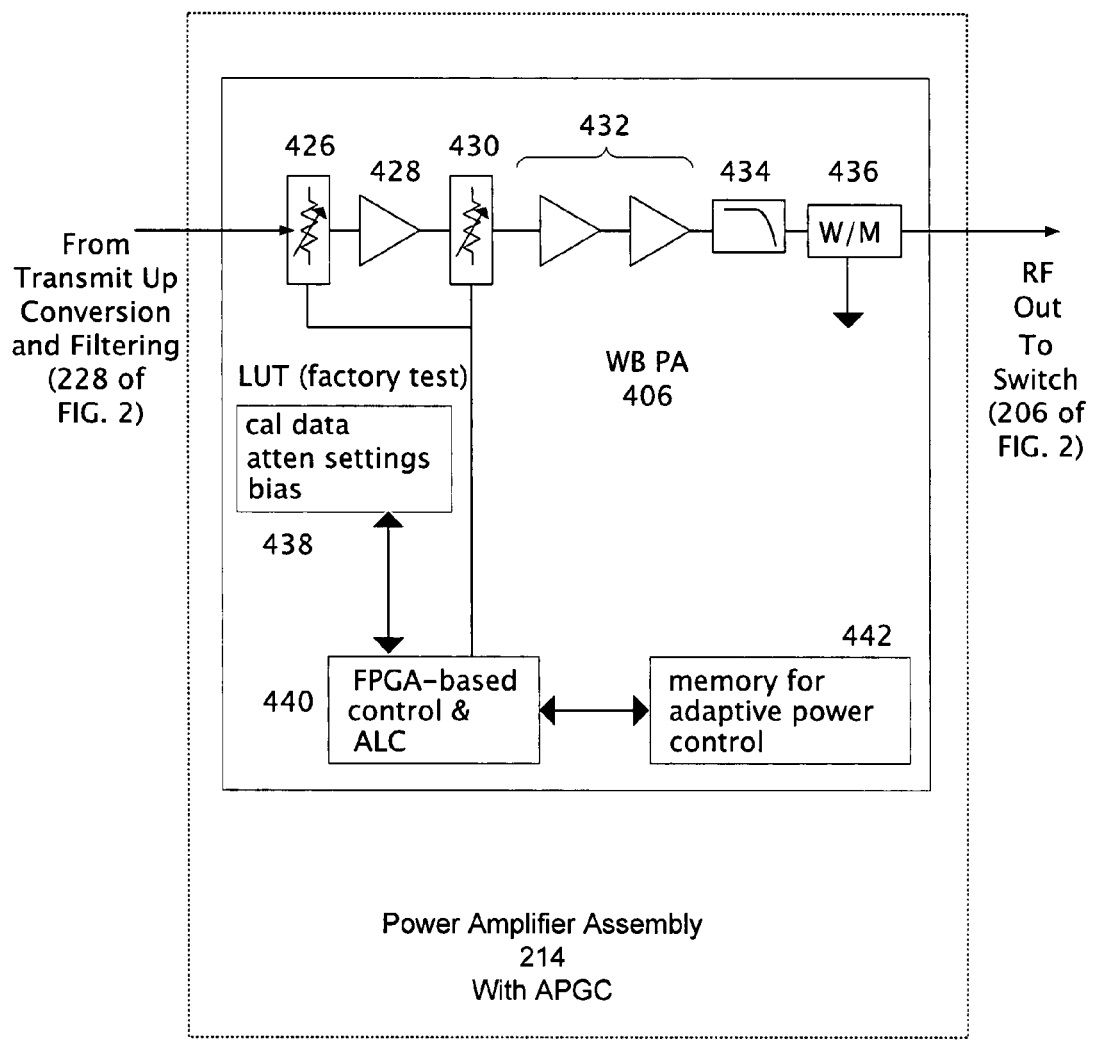
FIG. 4 is a block diagram showing the software defined radio power amplifier assembly, including, APGC.

FIG. 4 is a block diagram showing the software defined radio power amplifier assembly, including, adaptive preset gain control 214. In the example shown the power amplifier module can be a wide band PA. However in alternative examples the power amplifier need not be a wideband unit.

The wide band power amplifier module, or equivalently, the power amplifier module, input may be coupled to a first adjustable, or programmable, attenuator 426 having an output coupled to an amplifier module 428. The output of the amplifier module 428 may be coupled to a second programmable attenuator module 430. Each of the attenuator modules 426, 430, may be coupled to a wide band power amplifier look-up table 438, populated by data including calibration settings, attenuator settings, bias settings, and the like through a FPGA-based control & ALC. The calibration setting values are typically appropriate for optimizing the signal level at various points of the circuits to optimize power handling and signal-to-noise ratios. The output of the second attenuator 430 may be coupled to a plurality of amplifiers 432. The output of the plurality of the amplifiers may be coupled to a conventionally constructed low-pass filter 434 to suppress harmonic frequencies. The output of the low-pass filter 434 can be coupled to a power measurement circuit module 436 having an output that forms the output of the wide band power amplifier 406 that may be coupled to a switch (206 of FIG. 2).

Returning to the wide band power amplifier look-up table 438, the wide band power amplifier look-up table 438 may also be coupled to a field programmable gate array based control and automatic level control circuit 440 that provides control and automatic level control. Equivalently, a non-FPGA circuit may be utilized. The output of the field programmable gate array circuit 440 providing control and automatic level control functions, may be coupled to the first and second attenuator modules 426, 430. The field programmable gate array may also be coupled to a conventional memory 442 for storing adaptive power control data ("ALUT"). The field programmable gate array circuit 440 may be coupled to a RF control bus (not shown) that may be used to convey various data and control signals throughout the software defined radio to various modules and circuits. Control signals may include one or more adaptive preset gain control signals. The adaptive preset gain control signals may be generated by circuits 438, 440, 442 that implement a method of producing adaptive preset gain control signals.

Figure 5:
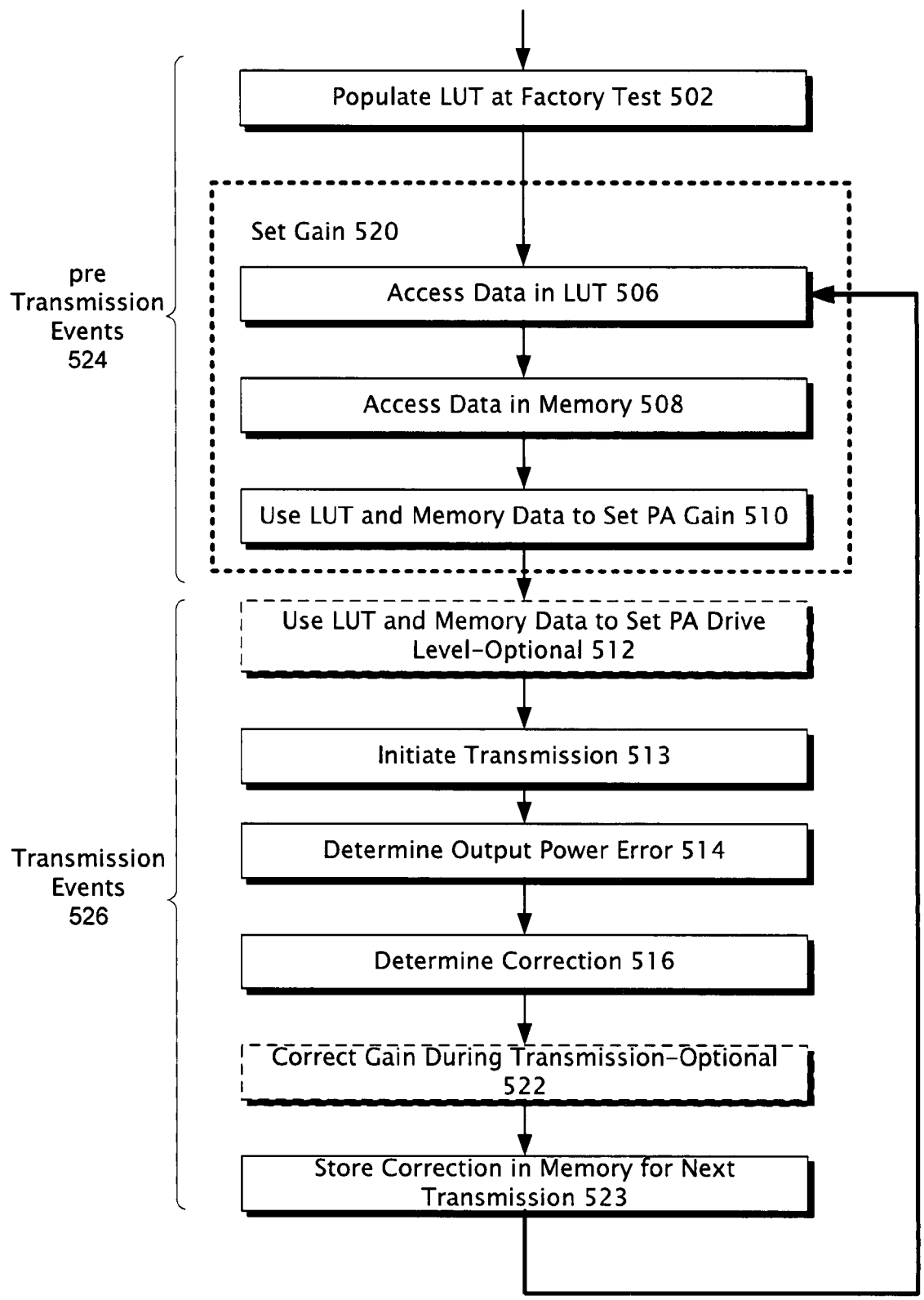
FIG. 5 a process flow diagram showing the process of adaptive preset gain control.

FIG. 5 a process flow diagram showing the process of adaptive preset gain control. The process may be performed by a series of pre transmission operations, or events, 502, 506, 508, 510, 520 and a series of operations, or events, occurring during a transmission 512, 513, 514, 516, 522, and 523. First, a look-up table may be populated at factory test 502. Next the gain is typically set 520, typically starting from a gain value determined at factory test 502 in this example. In alternative examples the gain may be initially set to a small starting value or any desired value. Then, a transmission event may be initiated 504.

Setting the gain includes several sub processes 506, 508, 510. Prior to a transmission, data memory look-up table may be accessed 506 in order to provide an initial setting of the automatic level control. Also, prior to a transmission, data stored in memory can be accessed 508. Next, the information accessed from a look-up table and memory can be used to set the power amplifier gain 510.

In alternative examples of adaptive preset gain control the process described in block 512 may be performed. There, information from the look-up table and memory may be used to set the power amplifier input drive level 512. Since the previously discussed drive levels may essentially be determined by the gain of RF processing (230 of FIG. 2) this may be equivalent to using adaptive preset gain control for the circuits shown in the transmission up conversion and filtering circuits (228 of FIG. 2).

At this point in the process transmission may be initiated 513, to actually transmit the signal. After actual power transmission, power corrections can be determined.

An output power error may be determined 514, and then a correction can be determined 516. In an alternative example of adaptive preset gain control the gain may be corrected during the current transmission 522. And finally, the correction can be stored in memory for use in the next transmission 523. The process control then returns to block 506 where the process may be repeated.

The processes described above may be carried out by the FPGA-Based control & automatic level control (440 of FIG. 4) working in conjunction with memories (438, 442 of FIG. 4), or their equivalents. Also the location of the processor or processors and memory, or memories may be equivalently disposed with other circuits or assemblies with the control signals executing the above process appropriately bused or wired to the corresponding circuitry.

The invention claimed is:

1. A method of providing automatic level control to a power amplifier comprising:
   storing manufacturing information into a look up table prior to a first amplification of a signal;
   setting an initial amplifier gain based on information from the look up table;
   performing a first amplification of a first signal during a first transmission utilizing the initial amplifier gain based on information from the look up table, where the first signal is coupled to an input of the power amplifier;
   obtaining adaptation information from the first amplification of the signal;
   storing adaptation information from the first amplification of the signal as a first adaptation; and
   setting a first amplifier gain based on the stored adaptation information.

2. The method of providing automatic level control to a power amplifier of claim 1, in which the first signal is a signal having modulation with a high peak to average power ratio.

3. The method of providing automatic level control to a power amplifier of claim 1, in which manufacturing information includes an initial calibration look up table with information to achieve normalization and is performed at factory test.

4. The method of providing automatic level control to a power amplifier of claim 3, in which the information to achieve normalization includes calibration data.

5. The method of providing automatic level control to a power amplifier of claim 3, in which the information to achieve normalization includes internal settings.

6. The method of providing automatic level control to a power amplifier of claim 3, in which the information to achieve normalization includes changes in parameters.

7. The method of providing automatic level control to a power amplifier of claim 3, in which the normalization is controlled by an ALC control circuit.

8. The method of providing automatic level control to a power amplifier of claim 1, in which the adaptation information includes system tolerances.

9. The method of providing automatic level control to a power amplifier of claim 1, in which the adaptation information includes external loss compensation.

10. The method of providing automatic level control to a power amplifier of claim 1, in which the adaptation information includes power variations.

11. The method of providing automatic level control to a power amplifier of claim 1, in which the adaptation information includes gain variations.

12. The method of providing automatic level control to a power amplifier of claim 1 further comprising:
    performing a subsequent amplification of a subsequent signal during a subsequent transmission of a plurality of subsequent transmissions, where the subsequent signal is coupled to an input of the power amplifier;
    obtaining information from the subsequent amplification of the signal;
    storing information from the subsequent amplification of the signal as a subsequent adaptation; and
    setting a subsequent amplifier gain based on the stored information.

13. The method of providing automatic level control to a power amplifier of claim 12 in which obtaining information, storing information, and setting a subsequent amplifier gain may be performed after each subsequent transmission of the plurality of transmissions.

14. A method of leveling an amplifier output comprising:
    populating a calibration look up table with a plurality of calibration settings;
    performing an initial transmission controlled by at least one of the plurality of calibration settings from the calibration look up table;
    populating a memory with adaptation information derived from the initial transmission; and
    setting the amplifier gain and drive levels with information from the calibration look up table and the memory.

15. The method of leveling an amplifier output of claim 14 further comprising:
    initiating a subsequent transmission controlled by the memory and the calibration look up table; and
    updating the memory with information obtained from the subsequent transmission.

16. The method of leveling an amplifier output of claim 14, in which the initial transmission and the subsequent transmission are signals having modulation with a high peak to average power ratio.

17. The method of leveling an amplifier output of claim 14, further comprising a power control circuit to determine an output power error.

18. The method of leveling an amplifier output of claim 17, in which the output power error is used to determine if changes are to be made in the amplifier output.

19. A gain control circuit comprising:
    an amplifier for amplifying a signal;
    a calibration look up table coupled to a controller for initially adjusting gain of the amplifier for a first amplification of the amplifier; and
    an adaptation look up table coupled to the controller for subsequently adjusting gain of the amplifier.

20. The gain control circuit of claim 19 in which the signal is a signal having a high peak to average power modulation.

* * * * *